United States Patent
Matsui

[11] Patent Number: 5,862,115
[45] Date of Patent: Jan. 19, 1999

[54] METHOD AND APPARATUS FOR RECORDING AN INFORMATION SIGNAL WITH SCRAMBLING THEREOF

[75] Inventor: Kazunari Matsui, Yokosuka, Japan

[73] Assignee: Victor Company of Japan, Ltd., Yokohama, Japan

[21] Appl. No.: 57,587

[22] Filed: Apr. 9, 1998

Related U.S. Application Data

[62] Division of Ser. No. 788,248, Jan. 27, 1997, Pat. No. 5,771,215, which is a division of Ser. No. 352,060, Nov. 30, 1994, Pat. No. 5,661,707.

[30] Foreign Application Priority Data

Nov. 30, 1993 [JP] Japan ................................. 5-325907

[51] Int. Cl.$^6$ ........................................................ G11B 5/09
[52] U.S. Cl. ........................... 369/59; 369/33; 369/47
[58] Field of Search .................................. 369/32, 33, 47, 369/48, 49, 54, 58, 60, 59, 124, 275.3; 360/18, 27, 40, 48

[56] References Cited

U.S. PATENT DOCUMENTS

| | | | |
|---|---|---|---|
| 4,603,413 | 7/1986 | Sinjou et al. | 369/59 |
| 5,122,912 | 6/1992 | Kanota et al. | 360/40 X |
| 5,195,073 | 3/1993 | Kato et al. | 369/47 |

FOREIGN PATENT DOCUMENTS

| | | |
|---|---|---|
| A-0 402 180 | 12/1990 | European Pat. Off. . |
| A-0 580 876 | 2/1994 | European Pat. Off. . |
| 2-13148 | 1/1990 | Japan . |
| 6-274885 | 9/1994 | Japan . |
| WO-A-93 17417 | 6/1993 | WIPO . |

*Primary Examiner*—Paul W. Huber
*Attorney, Agent, or Firm*—Jacobson, Price, Holman & Stern, PLLC

[57] ABSTRACT

When information signals are recorded on an information signal recording medium formed with circular information signal tracks, the information signals are recorded after being scrambled with scrambling signals of cyclic codes. The period at which the scrambling signal makes a round is determined longer than a time length of an information signal quantity recorded on the maximum recording capacity (e.g., the outermost tracks), or a part of the scrambling signals are used repeatedly. The information signal recording method can remove the correlation between the adjacent tracks, and thereby enable a stable tracking control.

14 Claims, 6 Drawing Sheets

METHOD AND APPARATUS FOR RECORDING AN INFORMATION SIGNAL WITH SCRAMBLING THEREOF

This is a Divisional application of Ser. No. 08/788,248 filed Jan. 27, 1997, now U.S. Pat. No. 5,771,215 issued Jun. 23, 1998, which in turn is a Divisional of application Ser. No. 08/352,060 filed Nov. 30, 1994, now U.S. Pat. No. 5,661,707 issued Aug. 26, 1997.

BACKGROUND OF THE INVENTION

1. Field of the Invention

The present invention relates to a method of recording information signals on an information signal recording medium formed with a plurality of circular tracks, and more specifically to a method of recording information signals scrambled with scrambling signals.

2. Description of the Prior Art

In general, in an optical disk such as a compact disk (CD), digital signals are recorded by forming concave and convex portions (referred to as pit and land portions) along tracks formed on the disk, and the light reflected from the pit and land portions is received by a quadrant optical sensor housed in an optical head, and further converted into electric signals to read information signals from the optical disk.

For focusing the detection light onto the optical disk, an objective lens of the optical system housed in a pickup is so controlled as to follow the surface deflection of the disk in accordance with an astigmatic method, for instance. In addition, for tracking to eccentric tracks, the pickup is so controlled as to follow the tracks in accordance with a three-beam method, push-pull method, heterodyne method, etc.

In the focusing and tracking control, the respective output signals of the double- or quadrant-divided optical sensor are calculated to obtain a focusing control signal and a tracking control signal for servo-controlling.

A laser beam emitted by the pickup produces a phase difference between the beam reflected from the pit portion and the beam reflected from the land portion, so that it is possible to obtain reproduced signals on the basis of the difference in reflected light intensity caused by the interference effect and then incident upon the optical sensor. In the case of a compact disk, data is recorded by forming pit and land pattern on the basis of EFM (eight to fourteen modulation) signals. Therefore, the recorded data can be reproduced by binarizing the reproduced signals modulated on the basis of the light intensity change along the pit and the land portions, and further demodulated into digital signals.

In the signal recording systems, two system, that is, a CAV (constant angular velocity) system in which the disk angular velocity is kept constant and CLV (constant linear velocity) system in which the track linear velocity is kept constant are so far known. In the case of the CAV system, the number of sectors of each track is equal to each other, and all the tracks are so formed that the sector heads of all the tracks are perfectly arranged on the radial lines extending from the disk center.

Further, in the case of the CLV system, since the track linear velocity is constant, although the sector heads of all the tracks do not match each other on the disk, there exists some cases where the sector heads of a part of the adjacent tracks are arranged along on the same radial line extending from the disk center.

Under these circumstances, in the case where a great quantity of the information signals have the same content such as music intermissions, no-music sections, no-image sections, etc. are recorded for instance when music or image information signals are recorded, the recorded information signals are scrambled with scrambling signals in general in order to prevent the signals of the same pit and land shape or arrangement from being recorded in the adjacent tracks.

The scramble procedure as described above is adopted to prevent the synchronizing signal for synchronizing the sector heads of information signals from being generated in the recorded data as a pseudo-synchronizing signal, that is, to improve the DSV (digital sum variation) controllability of the EFM signal. That is, the information signals and scrambling signals referred to as M (maximum) period sequence are scrambled with each other, and then the scrambled signals are recorded as the information signals. Here, the M period sequence used for the scrambling procedure is defined by cyclic codes represented by $(2^x-1)$ units of 0 or 1.

For instance, the prior art scrambling means adopted in the conventional CD-ROM outputs the M period sequence of cyclic codes of $(2^{15}-1=32767)$ represented by 0 or 1. Further, information signals are scrambled with the cyclic codes by using the same initial value (code) for each sector.

In the present tendency of the optical disk, the disk capacity and disk density are both increased more and more. In the prior art scrambling means as described above, however, when the information signals having the same content are recorded at the same positions at which the sector heads are arranged in the radial lines extending from the disk center, since the shape at the pit portion matches the shape at the land portion, correlation between both the portions increases, with the result that an amplitude of the tracking error signal is reduced and thereby the S/N (signal to noise) ratio decreases, thus causing a problem in that the tracking control cannot be executed stably.

SUMMARY OF THE INVENTION

With these problems in mind therefore, it is the object of the present invention to provide an information signal recording method which can remove the correlation between the adjacent tracks, when scrambled information signals of binary digital signals are recorded on an information recording medium formed with circular information tracks.

To achieve the above-mentioned object, the present invention provides a method of recording information signals of a binary digital signal train on an information signal recording medium formed with circular information signal tracks by scrambling the information signals with scrambling signals of cyclic codes, wherein a period at which the scrambling signals make a round is determined longer than a time length of an information signal quantity recorded on a predetermined portion at the information signal track of the maximum recording capacity.

In the above method of recording information signals, the information signals are scrambled by obtaining exclusive OR of the information signals and the cyclic codes composed of $(2^x-1)$ units of binary numbers; and further a degree x of the cyclic codes is determined as follows:

$$x > \log_2(8 \times B_{sect} \times S_{max} + 1)$$

where $B_{sect}$ denotes the number of bytes of the information signals recorded in one sector of the recording medium, and $S_{max}$ denotes the number of sectors included in an outermost circumferential track of the recording medium.

Further, the present invention provides a method of recording information signals of a binary digital signal train to an information signal recording medium formed with circular information signal tracks by scrambling the information signals with scrambling signals of cyclic codes, wherein a part of the scrambling signals is used repeatedly under overlapped conditions. Further, in the method of recording information signals, the information signals are scrambled by obtaining exclusive OR of the information signals and the cyclic codes composed of ($2^x-1$) units of binary numbers; and further a degree x of the cyclic codes is determined as follows:

$$x > \log_2\{(8 \times B_{sec} \times (1+S_{max}/S_{min})1+\}$$

where $B_{sect}$ denotes the number of bytes of the information signals recorded in one sector of the recording medium, $S_{max}$ denotes the number of sectors included in an outermost circumferential track of the recording medium, and $S_{min}$ denotes the number of sectors included in an innermost circumferential track of the recording medium.

DETAILED DESCRIPTION OF THE EMBODIMENTS

Embodiments of the method of recording information signals according to the present invention will be described hereinbelow with reference to the attached drawings.

Figure 1:
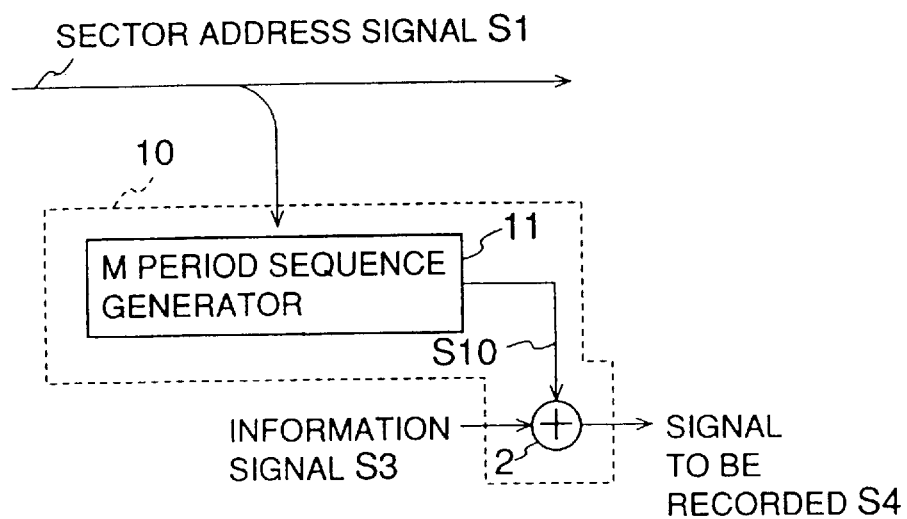
FIG. 1 is a block diagram showing the scrambling means of a first embodiment of the information signal recording method according to the present invention.

In FIG. 1, image or audio digital information signals S3 (which have been error-corrected and interleaved) are scrambled by a scrambled signal generating section 10, and then recorded on a compact disk as the scrambled information signals S4.

The scrambled signal generating section 10 shown in FIG. 1 is composed of an M (maximum) period sequence generator 11 (constructed by shift registers) for generating M period sequence (scrambling signals) S10, and an adder section 2 for obtaining an exclusive OR of the M period sequence S10 and the information signals S3, and outputting the scrambled information signals as information signals S4 to be recorded. In more detail, sector address signals S1 separated from the information signals S3 are inputted to the M period sequence generator 11. Then, the shift registers (not shown) of the M period sequence generator 11 are reset to start generating the scrambling signals S10. The information signals S3 are scrambled with the scrambling signals S10 through the adder 2, and then outputted as the scrambled information signals S4 actually recorded on a recording medium.

Figure 2A:
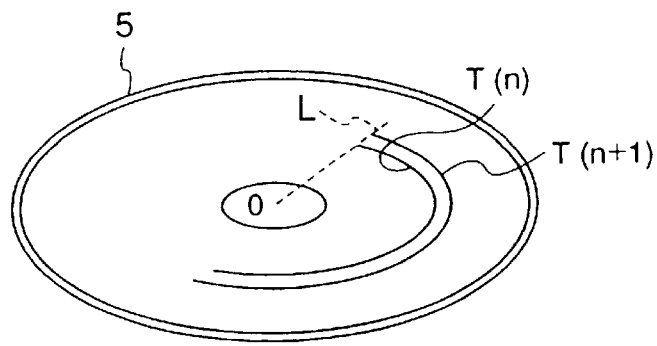
FIGS. 2A to 2C are illustrations for assistance in explaining the relationship between the scramble procedure and the M period sequence in the method according to the present invention.
Figure 2B:
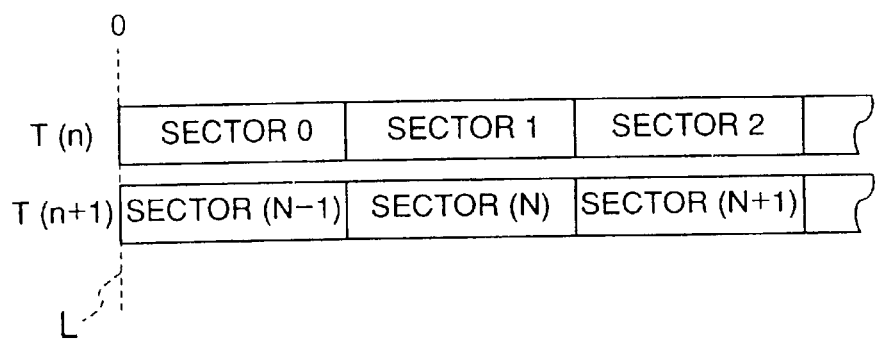
Figure 2C:
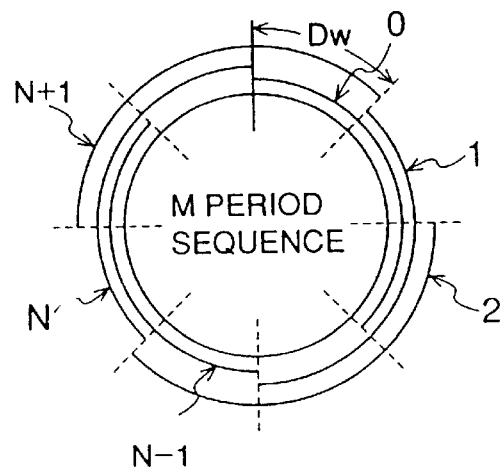

FIGS. 2A to 2C show the relationship between the scramble procedure and the M period sequence. As shown in FIG. 2A, in the recording region of an information signal recording medium 5 such as a disk, a T(n)-th track and a T(n+1)-th track are formed concentrically or spirally. In these drawings, a CLV (constant linear velocity) recording system is shown, in which the sectors of the respective tracks start from the same radial line L extending from the disk center O. FIG. 2B shows a straight line representation of the information signals recorded in two adjacent tracks in the CLV recording system. Further, FIG. 2C shows the arrangement of the recorded signals in this CLV recording system Here, the method of deciding the degree and the initial value of the M period sequence used by the scrambled signal generating section 10 will be described. In the case of the recording system of the CLV system, the constants related to the recorded disk are previously given as follows:

$S_{min}$: the number of sectors included in the innermost circumferential track $S_{max}$: the number of sectors included in the outermost circumferential track $D_w$: Offset width (unit: sector) between the initial value of an M period sequence and that of a next M period sequence ($0 < D_w$)

Figure 3A:
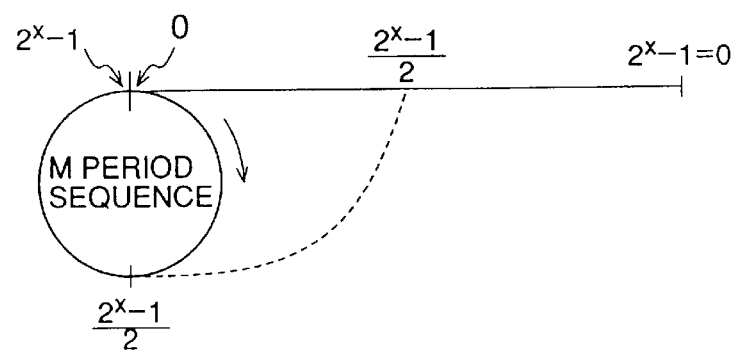
FIGS. 3A and 3B are illustrations showing the linear scramble patterns of the outermost circumferential track and the succeeding circumferential track in the first embodiment of the information signal recording method according to the present invention.
Figure 3B:
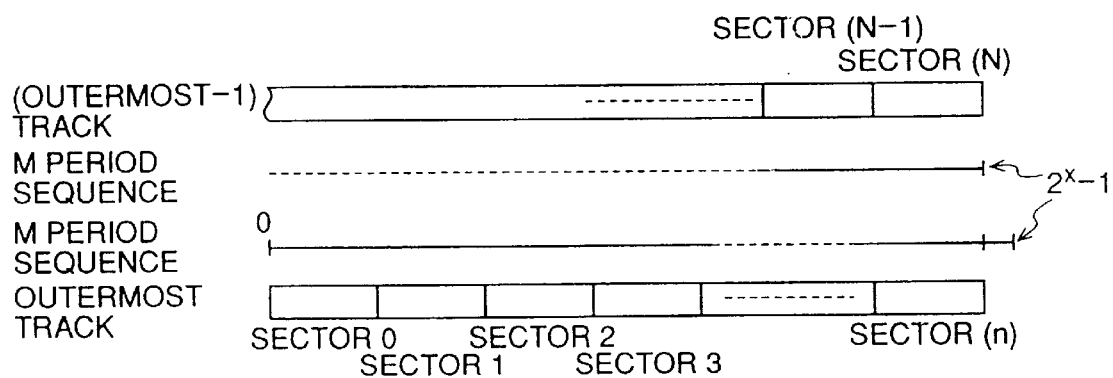

$C_{ycle}$: the maximum number of sectors expressed by the cyclic period ($2^x-1$) of an M period sequence $B_{sect}$: the number of information signal bytes contained in one sector FIGS. 3A and 3B show the positional relationship of the information signals recorded through the scramble procedure (after having been scrambled by the scrambled signal generating section 10 of FIG. 1) at the outermost circumferential track and the circumferential track adjacent to the outermost track. In the M period sequence shown in FIG. 3A, the scrambling signals (whose cyclic period is longer than the time length of the information signal quantity recorded at the outermost circumferential track) and the information signals are recorded at the outermost circumferential track in such a way as to one-to-one (1:1) correspond to each other.

In the arrangement of the recorded signals shown in FIG. 3B, the information signals recorded on the two adjacent tracks are rewritten linearly beginning from the same radial line L extending from the disk center O shown in FIG. 2A, in spite of the fact that the recorded signals are actually recorded concentrically or spirally beginning from the disk center O as shown in FIG. 2A.

From the nature of the M period sequence, even if a great quantity of the same information signals are recorded, since different scrambled signals can be recorded in the information signal recording range of the outermost circumferential track, it is possible to record different signals at the adjacent tracks on the radial line L extending from the disk center O at all the tracks from the innermost circumferential track to the outermost circumferential tack.

Under the considerations as described above, the conditions of the degree of the M period sequence to be used are as follows:

$$S_{max} < C_{ycle} \quad (1)$$

Here, $C_{ycle}$ can be expressed in unit of sector as follows:

$$C_{ycle} = (2^x - 1)/(8 \times B_{sect}) \quad (2)$$

Accordingly, the degree x of the required M period sequence can be obtained by the following formulae (3), (4) and (5) as expressed below:

$$S_{max} < (2^x - 1)/(8 \times B_{sect}) \quad (3)$$

$$2_x > 8 \times B_{sec} \times S_{max} + 1 \quad (4)$$

$$x > \log_2 (8 \times B_{sec} \times S_{max} + 1) \quad (5)$$

Therefore, when the information signals S3 are scrambled by the scrambling signals S10 having a cyclic period $(2^x-1)$ of the M period sequence determined by the degree obtained by the above formula (5), it is possible to obtain the scrambled recorded signals S4 for providing a stable tracking.

For instance, in the case of the CD-ROM, since the quantity of information signals contained in one sector is 2352 bytes, and the quantity of information signals contained in the outermost circumferential track is about 22 sectors, when the degree X is calculated in accordance with the formula (5), as far as the M period sequence of 19 degrees or more is used, it is possible to record different signals at the adjacent tracks on the radial line extending from the disk center all over the tracks from the innermost to the outermost circumferential tracks.

As described above, since the period at which the scrambling signals S10 make a round is determined to be longer than the time length of the information signal quantity recorded at the maximum capacity track (i.e., the outermost circumferential track), it is possible to remove the correlation between the adjacent tracks.

Therefore, even if the track pitch is narrowed on the recording medium for higher recording density, it is possible to execute a stable tracking control.

Figure 4A:
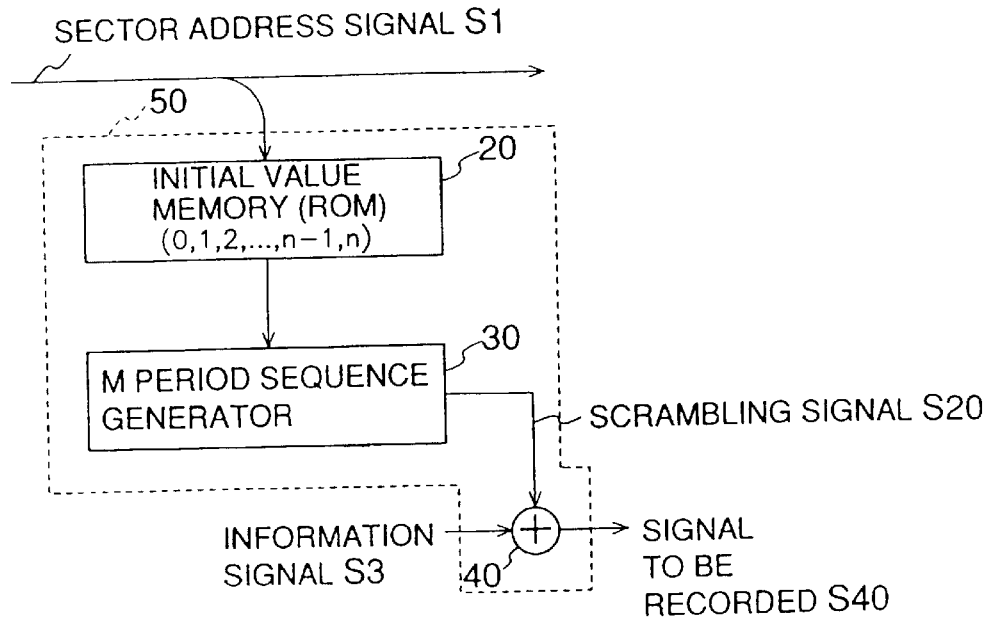
FIG. 4A is a block diagram showing the scrambling means of a second embodiment of the information signal recording method according to the present invention.

FIG. 4A shows the scrambling means for executing a second embodiment of the information signal recording method according to the present invention.

Figure 4B:
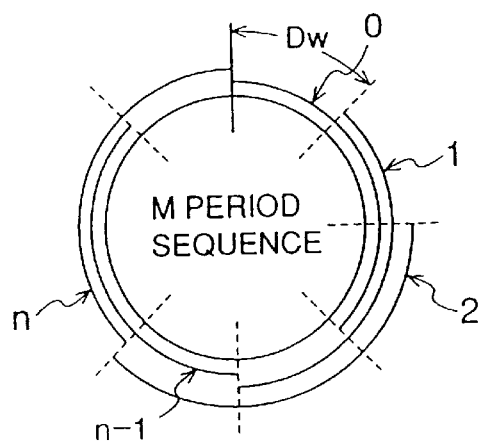
FIG. 4B is an illustration for assistance in explaining the M period sequence generated by the scrambling means shown in FIG. 4A.

As shown in FIG. 4A, the address of a scrambled signal generating section 50 is designated on the basis of sector address signals S1 separated by the information signals S3. The section 50 is composed of an initial value memory 20 (e.g., ROM) for generating previously stored initial values, an M period sequence generator 30 (composed of shift registers) for generating the scrambling signals S20 of the M period sequence on the basis of the output of the memory 20, and an adder 40 for adding (exclusive OR) the information signals S3 of a digital signal train and the scrambling signals S20 to form scrambled signals S40 to be recorded. In this second embodiment, as shown in FIG. 4B, a predetermined length $D_w$ is offset between the initial value of the M period sequence and the initial value of the succeeding M period sequence.

Figure 5A:
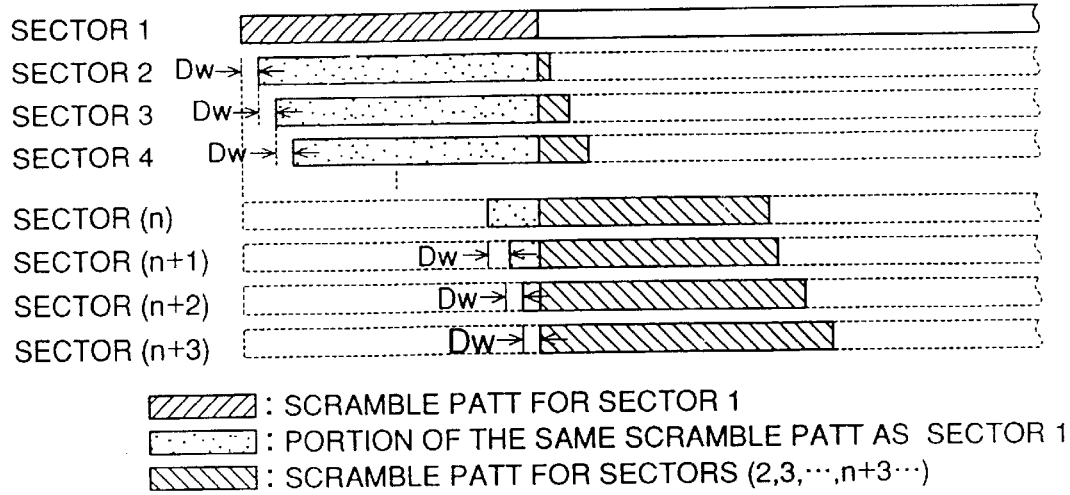
FIGS. 5A and 5B are illustrations showing the linear scramble patterns of the innermost circumferential track and the succeeding circumferential track in the second embodiment of the information signal recording method according to the present invention.
Figure 5B:
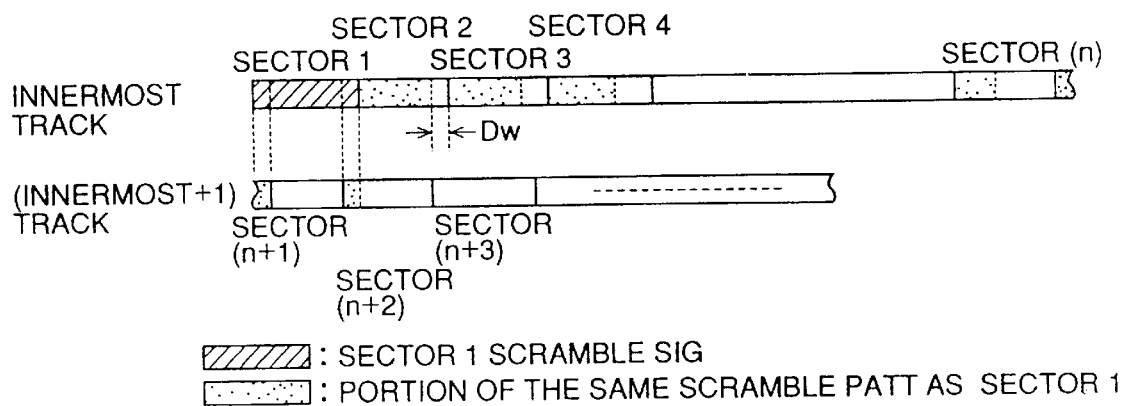

FIGS. 5A and 5B show the positional relationship of the information signals recorded through the scramble procedure at the innermost circumferential track and the circumferential track adjacent to the innermost track after having been scrambled by the scrambled signal generating section 50 shown in FIG. 4A.

In the M period sequence shown in FIG. 5A, the cyclic period of the scrambling signals is assumed to be longer than the time length of the number of information bits contained in at least two sectors.

In the M period sequence as shown in FIG. 5A, the scramble procedure is executed by offsetting the initial value of the M period sequence at the present sector by an offset value $D_w$ from the initial value of the preceding sector.

In the arrangement of the recorded signals shown in FIG. 5B, the information signals recorded on the two adjacent tracks are rewritten linearly beginning from the radial line L extending from the disk center O shown in FIG. 2A, in spite of the fact that the recorded signals are actually recorded concentrically or spirally beginning from the disk center O as shown in FIG. 2A.

In FIG. 5, the problem arises with respect to the correlation between signals recorded at the first sector 1 of the innermost circumference and signals recorded at the sectors (n+1) and (n+2) of the adjacent circumferential track (the innermost+1) at the same radial position of the recording medium.

In FIG. 5B, when the scrambled information signals including the scrambling signals are recorded at the adjacent sectors of the problem, in the case of the same information signals, the same scrambled signals are recorded in the sector 1 of the innermost circumferential track and the sectors (n+1) and (n+2) of the succeeding track.

Therefore, in the case where the information signals for the sector corresponding to the innermost circumference $S_{min}$ can be recorded, it is necessary to execute the scramble procedure of the sector $(S_{min}+1)$ by use of an initial value of the M period sequence offset from the M period sequence used for the sector 1 by a value more than the M period sequence code used for one sector.

That is, the above-mentioned content can be expressed as follows:

$$S_{min} \times D_w > 1 \quad (6)$$

Here, the outermost circumferential track of the disk will be taken into account.

In practice, the outermost circumferential track and the adjacent (outermost circumference−1) track must be considered. Here, however, the assumption is made that there exists another adjacent (outermost circumference+1) track.

Since the object that the same scramble pattern must not be generated between the two adjacent tracks is the same, the method of determining the constants will be explained.

When the degree x of the M period sequence is decided on the basis of the information signal bits contained in the outermost circumferential track, since the same scramble pattern as that used at the outermost circumference is to be recorded at the (outermost+1) circumferential track, it is necessary to select the M period sequence having a cyclic period longer than that which can circulate the sectors obtained by adding the number of sectors $(1/D_w)$ to the number of sectors contained in the outermost circumferential track, until a part of the M period sequence used at the first sector of the outermost circumferential track will not be used again. Therefore, the following formula must be satisfied:

$$(S_{max} + 1/D_w) \times D_w < C_{ycle} \quad (7)$$

Therefore, on the basis of the above formulae (6) and (7), the following formula can be obtained:

$$1/S_{min} < D_w < (C_{ycle}-1)/S_{max} \quad (8)$$

Here, $S_{min}$ and $S_{max}$ can be decided on the basis of the disk to which information signals are to be recorded. Accordingly, when the $C_{ycle}$ is rewritten in unit of sector, the formula (8) can be expressed as $$C_{ycle} = (2^x - 1)/(8 \times B_{sect}) \quad (9)$$

Therefore, it is possible to obtain the degree x of the M period sequence on the basis of the right and left sides of the formula (8) and in accordance with the following formulae (10), (11) and (12) as follows:

$$1/S_{min}[(2^x-1)/(8 \times B_{sect})-1]/S_{max} \quad (10)$$

$$2^x > 8 \times B_{sec} \times (1 + S_{max}/S_{min}) + 1 \quad (11)$$

$$X > \log_2[8 \times B_{sec} \times (1 + S_{max}/S_{min}) + 1] \quad (12)$$

The right and left sides of the formula (7) are both constants, so that it is possible to decide the offset width $D_w$.

For instance, in the CD-ROM, since the information signal quantity contained in one sector is 2352 bytes and the numbers of sectors contained in the outermost and innermost circumferential tracks are about 22 and 9 sectors respectively, when the degree x is calculated in accordance with the formula (12), it is understood that the M period sequence of 16 degrees or more must be used. That is, when the scrambling signals of 16 degrees or more are used, it is possible to record different signals at the adjacent tracks on the same radial lines L extending from the disk center O all over the tracks from the innermost and outermost circumferential tracks.

Here, when the results of this second embodiment are compared with those of the first embodiment, in the case of the first embodiment, the M period sequence of 19 degrees is necessary to remove the correlation between the adjacent tracks. In the case of the second embodiment, on the other hand, the same effect can be obtained using the M period sequence of 16 degrees.

As described above, it is possible to remove the correlation between the adjacent tracks by using a part of the scrambling signals repeatedly under overlapped conditions, so that it is possible to execute the tracking control stably even if the track pitch is reduced.

A modification of the second embodiment will be described. In this modification, the scrambled signal generating section 50 shown in FIG. 4A is used.

Figure 6A:
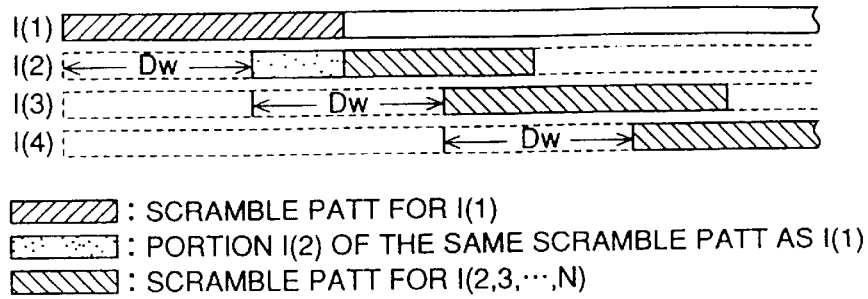
FIGS. 6A to 6C are illustrations showing the linear scramble patterns of the innermost circumferential track and the outermost circumferential track and the tracks adjacent thereto respectively in a modification of the second embodiment of the information signal recording method according to the present invention.
Figure 6B:
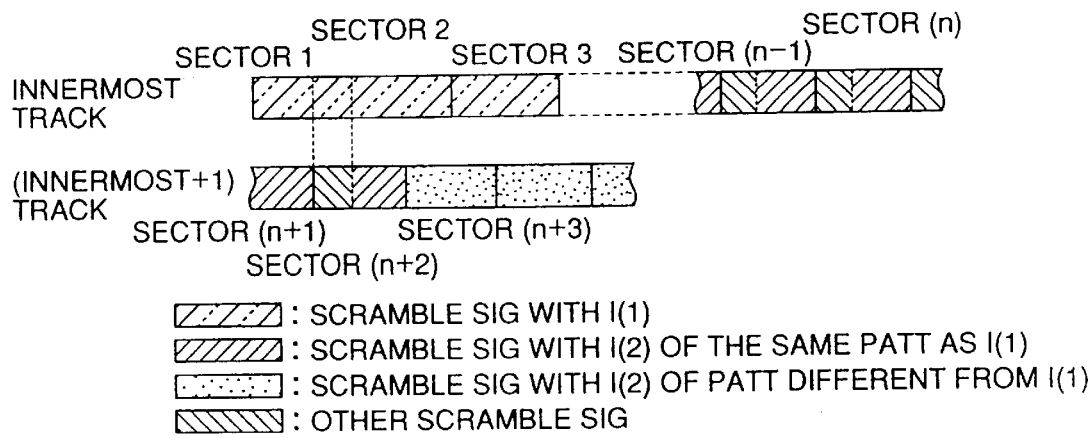

FIGS. 6A and 6B show the positional relationship of the information signals recorded through the recording procedure (after having been scrambled by the section 50) of this modification (which is different from the second embodiment) at the innermost and outermost circumferential tracks of the recording medium.

In the M period sequence shown in FIG. 6A, assuming that the cyclic period of the scrambling signals is longer than the number of information signal bits contained in at least two sectors, the initial value is so determined that the same pattern can be included only within a range of $(1-D_w)$ in the succeeding scramble pattern.

In the case where some lower significant bits of address values of the sector address signals S1 are used as the addresses in the initial value memory 20 to obtain an initial value, the initial value varies in accordance with these addresses. On the contrary, in the case where some lower significant bits of address values of the sector address signals S1 are ignored and the remaining address values are used as the addresses in the initial value memory 20 to obtain an initial value, since the same address is repeatedly read from the initial value memory 20 while the ignored lower significant bits are varying and hence the initial value does not vary, the scrambled signals with the fixed initial value are used over sequential sectors.

Figure 6C:
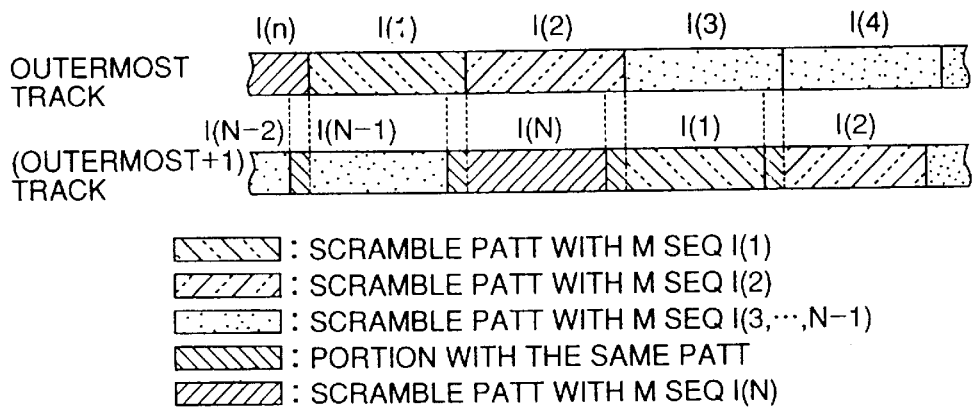

In the arrangement of the recorded signals shown in FIGS. 6B and 6C, the information signals recorded on the two adjacent tracks are rewritten linearly beginning from the radial line L extending from the disk center O shown in FIG. 2A, in spite of the fact that the recorded signals are actually recorded concentrically or spirally beginning from the disk center O as shown in FIG. 2A.

The innermost circumferential track is taken into account.

In the same way as with the case of the second embodiment, the problem arises with respect to the correlation between the first signal recorded in the sector 1 of the innermost circumferential track and the signals recorded within the range at the adjacent track between the two radial lines L obtained by extending from the disk center O to the first and last of the sector 1 of the innermost circumferential track.

In FIG. 6B, the scramble procedure to the sectors (n+1) and after is executed using of the initial value of the scrambling signals offset more than the information signal quantity contained in one sector from the initial value of the scrambling signals used for the sector 1.

Here, if the number of times that one scrambling signal is repeated continuously is denoted by $M_{loop}$, the formula (13) can be expressed as:

$$(S_{min}/M_{loop}) \times D_w > 1 \quad (13)$$

Here, the outermost circumferential track of the disk will be taken into account.

In practice, the outermost circumferential track and the adjacent (outermost circumference−1) track must be considered. Here, however, the assumption is made that there exists another adjacent (outermost circumference+1) track.

Since the object that the same scramble pattern must not be generated between the two adjacent tracks is the same, here, the method of deciding the constants will be explained.

When the degree of the M period sequence is decided on the basis of the information signal bits contained in the outermost circumferential track, at the (outermost circumference +1) track since the scrambled signals quite the same as those used for the outermost circumferential track are recorded, at the (outermost circumference+1) track it is necessary to use the scrambling signal $B_{sect}$ or more before the scrambling signal used at the first of the outermost circumferential track, as the scrambling signal used at the sector positioned on the same radial line of the first of the outermost circumferential track. Therefore, the following formula can be obtained:

$$[(S_{max}/M_{loop})+1/D_w] \times D_w < C_{ycle} \quad (14)$$

Therefore, on the basis of the above formulae (13) and (14), the following formula can be obtained:

$$M_{loop}/S_{min} < D_w < (C_{ycle}-1) \times M_{loop}/S_{max} \quad (15)$$

Here, $S_{min}$ and $S_{max}$ can be both decided on the basis of the disk to which information signals are to be recorded. Accordingly, the $C_{ycle}$ of the formula (16) can be expressed in unit of sector as follows:

$$C_{ycle} = (2^x - 1)/(8 \times B_{sect}) \quad (16)$$

Therefore, it is possible to obtain the degree x of the M period sequence on the basis of the right and left sides of the formula (15) and in accordance with the following formulae (17), (18) and (19) as follows:

$$M_{loop}/S_{min} < [(2^x-1)/(8 \times B_{sect})-1] \times M_{loop}/S_{max} 2^x > 8 \times B_{sec} \times (1+S_{max}/S_{min})+1 \qquad (18)$$

$$X > \log_2[8 \times B_{sec} \times (1+S_{max}/S_{min})+1] \qquad (19)$$

The formula (19) is the same as that (12) of the second embodiment, so that it is possible to obtain the same result.

Here, when the results of this modification are compared with those of the first embodiment, in the case of the first embodiment, the M period sequence of 19 degrees is necessary to remove the correlation between the adjacent tracks. In the case of this modification, on the other hand, the same effect can be obtained using the M period sequence of 16 degrees.

Further, since the same scrambling signals can be used repeatedly, there exists another effect such that the number of initial values to be recorded on the initial value storing section 20 shown in FIG. 4A can be reduced as compared with that of the second embodiment.

In the above-mentioned embodiments, although the present invention has been explained by taking the case where information signals are recorded in the CLV system, it is of course possible to adopt the present invention when the information signals are recorded in the CAV system.

As described above, the information signal recording method according to the present invention provides the following excellent effects:

In the case of the first embodiment, since the cyclic period in which the scrambling signals make a round is determined to be longer than the time length of the information signal quantity of the track having the maximum recording capacity, it is possible to remove the correlation between the adjacent tracks.

Therefore, it is possible to execute a stable tracking control even if the track pitch is reduced on the recording medium for higher recording density.

Further, in the second embodiment, since a part of the scrambling signals is used repeatedly, it is possible to decrease the number of initial values of the scrambling signals to be stored in the memory section. Further, since the degrees of the scrambling signals (M period sequence) can be reduced, it is possible to simplify the scrambled signal generating section to that extent.

What is claimed is:

1. A storage medium formed with circular information signal tracks divided into a plurality of sectors having sector addresses, information signals of a binary digital signal train being recorded in the storage medium, the information signals being scrambled with a first scrambling signal having cyclic codes and a second scrambling signal having the cyclic codes, the first and second scrambling signals being different from each other per predetermined number of sequential sectors, the first scrambling signal being generated based on at least a first initial value and a second scrambling signal being generated based on a second initial value, the first initial value being obtained, based on the sector addresses, over a first set of sequential sectors having said predetermined number of sequential sectors, the second initial value being obtained, based on the sector addresses, over a second set of sequential sectors having said predetermined number of sequential sectors, the first initial value being obtained by offsetting the second initial value by a predetermined offset value.

2. The storage medium according to claim 1, wherein the first scrambling signal is generated based on the first initial value over the first set of sequential sectors, and the second scrambling signal is generated based on the second initial value over the second set of sequential sectors.

3. The storage medium according to claim 1, wherein the predetermined offset value is decided so that the first and second scrambling signals different from each other per said predetermined number of sequential sectors include a same scrambling pattern between the first and second sets of sequential sectors.

4. A storage medium formed with circular information signal tracks divided into a plurality of sectors having sector addresses, information signals of a binary digital signal train recorded in the storage medium, the information signals being scrambled with repeated use of a first scrambling signal that starts at a first initial value with respect to first sequential sectors of a predetermined number of sectors and with repeated use of a second scrambling signal that starts at a second initial value with respect to second sequential sectors of the predetermined number of sectors, the first scrambling signal being generated based on the first initial value used over the first sequential sectors, the first initial value being generated based on the sector address, the second scrambling signal being generated based on the second initial value used over the second sequential sectors, the second initial value being generated based on the sector address, wherein a starting point of the second scrambling signal corresponding to the second initial value is offset by a predetermined offset value from another starting point of the first scrambling signal corresponding to the first initial value.

5. An apparatus of recording information signals of a binary digital signal train to an information signal storage medium formed with circular information signal tracks divided into sectors having sector addresses, the apparatus comprising:

a first generator, responsive to the sector addresses, to generate at least a first specific initial value over a first set of sequential sectors having a predetermined number of sequential sectors and a second specific initial value over a second set of sequential sectors having said predetermined number of sequential sectors, the first initial value being obtained by offsetting the second initial value by a predetermined offset value;

a second generator to generate a first scrambling signal having cyclic codes based on at least the first initial value and a second scrambling signal having the cyclic codes based on at least the second initial value, the first and second scrambling signals being different from each other per said predetermined number of sequential sectors; and a scrambler to scramble the information signals with the first and second scrambling signals different from each other per said predetermined number of sequential sectors to output signals to be recorded to the storage medium.

6. The apparatus according to claim 5, wherein the second generator generates the first scrambling signal based on the first initial value over the first set of sequential sectors, and the second scrambling signal based on the second initial value over the second set of sequential sectors.

7. The apparatus according to claim 5, wherein the predetermined offset value is decided so that the first and second scrambling signals different from each other per said predetermined number of sequential sectors include a same scrambling pattern between the first and second sets of sequential sectors.

8. A recording apparatus for recording information signals of a binary digital signal train to an information signal recording medium formed with circular information signal tracks divided into a plurality of sectors having sector addresses, the apparatus comprising:

means for generating a first initial value based on the sector address, the first initial value being used over first sequential sectors of a predetermined number of sectors;

means for generating a second initial value based on the sector address, the second initial value being used over second sequential sectors of the predetermined number of sectors;

means for generating a first scrambling signal based on the first initial value;

means for generating a second scrambling signal based on the second initial value;

means for scrambling the information signals per sector with repeated use of the first scrambling signal that starts at the first initial value with respect to each sector of the first sequential sectors and with repeated use of the second scrambling signal that starts at the second initial value with respect to each sector of the second sequential sectors, wherein a starting point of the second scrambling signal corresponding to the second initial value is offset by a predetermined offset value from another starting point of the first scrambling signal corresponding to the first initial value.

9. A method of recording information signals of binary digital train on an information signal storage medium formed with circular information signal tracks by scrambling the information signals with scrambling signals of cyclic codes, wherein a period at which the scrambling signals make a round is determined longer than a time length of an information signal quantity recorded on a predetermined portion at the information signal track of the maximum recording capacity.

10. The method of recording information signals of claim 9, wherein the information signals are scrambled by obtaining exclusive OR of the information signals and the cyclic codes of $(2^x-1)$ units of binary numbers; and further a degree x of the cyclic codes is determined as follows:

$$[x>\log_2(8 \cdot B_{sect} \cdot S_{max}+1)] x>\log_2(8 \times B_{sect} \times S_{max}+1)$$

where $B_{sect}$ denotes the number of bytes of the information signals recorded in one sector of the storage medium, and $S_{max}$ denotes the number of sectors included in an outermost circumferential track of the storage medium.

11. A method of recording information signals of a binary digital signal train to an information signal storage medium formed with circular information signal tracks divided into a plurality of sectors having sector addresses by scrambling the information signals per sector with scrambling signals having cyclic codes, the method comprising the steps of:

generating, based on the sector addresses, at least a first initial value over a first set of sequential sectors having a predetermined number of sequential sectors and a second initial value over a second set of sequential sectors having said predetermined number of sequential sectors, the first initial value being obtained by offsetting the second initial value by a predetermined offset value;

generating a first scrambling signal based on at least the first initial value and a second scrambling signal based on at least the second initial value, the first and second scrambling signals being different from each other per said predetermined number of sequential sectors; and scrambling the information signals with the first and second scrambling signals different from each other per said predetermined number of sequential sectors.

12. The method according to claim 11, wherein the first scrambling signal is generated based on the first initial value over the first set of sequential sectors, and the second scrambling signal is generated based on the second initial value over the second set of sequential sectors.

13. The method according to claim 11, wherein the predetermined offset value is decided so that the first and second scrambling signals different from each other per said predetermined number of sequential sectors include a same scrambling pattern between the first and second sets of sequential sectors.

14. A method of recording information signals of a binary digital signal train to an information signal recording storage medium formed with circular information signal tracks by scrambling the information signals with scrambling signals having cyclic codes, the tracks being divided into a plurality of sectors each having a sector address, the method comprising the steps of:

generating a first initial value based on the sector address, the first initial value being used over first sequential sectors of a predetermined number of sectors;

generating a second initial value based on the sector address, the second initial value being used over second sequential sectors of the predetermined number of sectors;

generating a first scrambling signal based on the first initial value;

generating a second scrambling signal based on the second initial value; and scrambling the information signals per sector with repeated use of the first scrambling signal that starts at the first initial value with respects to each sector of the first sequential sectors and with repeated use of the second scrambling signal that starts at the second initial value with respect to each sector of the second sequential sectors, wherein a starting point of the second scrambling signal corresponding to the second initial value is offset by a predetermined offset value from another starting point of the first scrambling signal corresponding to the first initial value.

\* \* \* \* \*